(12) United States Patent
Kim

(10) Patent No.: US 11,607,873 B2
(45) Date of Patent: Mar. 21, 2023

(54) PRINTING PAD, METHOD OF MANUFACTURING WINDOW USING THE SAME, AND METHOD OF MANUFACTURING ELECTRONIC DEVICE USING THE PRINTING PAD

(71) Applicant: Samsung Display Co., Ltd., Yongin-si (KR)

(72) Inventor: Tecksoo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 17/326,331

(22) Filed: May 21, 2021

(65) Prior Publication Data

US 2022/0097355 A1 Mar. 31, 2022

(30) Foreign Application Priority Data

Sep. 25, 2020 (KR) .................. 10-2020-0125121

(51) Int. Cl.
*B32B 37/10* (2006.01)
*G06F 1/16* (2006.01)
*H01L 27/146* (2006.01)

(52) U.S. Cl.
CPC ............ *B32B 37/10* (2013.01); *G06F 1/1686* (2013.01); *H01L 27/14683* (2013.01); *B32B 2307/41* (2013.01); *B32B 2457/20* (2013.01)

(58) Field of Classification Search
None
See application file for complete search history.

(56) References Cited

U.S. PATENT DOCUMENTS

| | | | | |
|---|---|---|---|---|
| 5,408,926 A * | 4/1995 | Alder | ...................... | B41M 1/00 101/169 |
| 5,537,921 A * | 7/1996 | Adner | .................. | B41F 17/001 101/35 |
| 6,931,988 B1 * | 8/2005 | Sherf | .................... | B41F 17/001 101/163 |
| 7,498,277 B2 * | 3/2009 | Pace | ....................... | D06P 5/003 428/41.2 |

(Continued)

FOREIGN PATENT DOCUMENTS

| | | |
|---|---|---|
| KR | 10-1193981 | 10/2012 |
| KR | 10-2090643 | 3/2020 |
| KR | 10-2095050 | 3/2020 |

*Primary Examiner* — Francisco W Tschen
*Assistant Examiner* — Abhishek A Patwardhan
(74) *Attorney, Agent, or Firm* — H.C. Park & Associates, PLC

(57) ABSTRACT

A method of manufacturing a window includes: providing an ink pattern to a printing pad; providing the printing pad and the ink pattern to a target substrate; and removing the printing pad from the target substrate, the ink pattern including: a first bezel line surrounding at least one hole; and a second bezel line surrounding the first bezel line, the printing pad including: a top surface; a bottom surface; and a side surface connecting the top surface and the bottom surface, the side surface including a first pattern portion, in which the first bezel line is formed, and a second pattern portion, in which the second bezel line is formed. The first pattern portion has an inclination angle equal to or greater than about 46 degrees and equal to or smaller than about 90 degrees based on the bottom surface of the printing pad.

16 Claims, 12 Drawing Sheets

(56) References Cited

U.S. PATENT DOCUMENTS

| | | | | |
|---|---|---|---|---|
| 7,644,660 | B1* | 1/2010 | Clark | B41F 17/001 |
| | | | | 101/35 |
| 10,549,521 | B2* | 2/2020 | Adner | B41F 17/001 |
| 2001/0001380 | A1* | 5/2001 | Holmberg | H05K 9/0045 |
| | | | | 101/41 |
| 2003/0087047 | A1* | 5/2003 | Blauer | B60R 13/005 |
| | | | | 428/31 |
| 2015/0158288 | A1* | 6/2015 | Gemelli | B41F 17/30 |
| | | | | 101/333 |
| 2016/0207302 | A1* | 7/2016 | Shneider | B41F 17/00 |
| 2021/0362488 | A1* | 11/2021 | Cheng | B41F 17/001 |

* cited by examiner

PRINTING PAD, METHOD OF MANUFACTURING WINDOW USING THE SAME, AND METHOD OF MANUFACTURING ELECTRONIC DEVICE USING THE PRINTING PAD

CROSS-REFERENCE TO RELATED APPLICATION

This application claims priority from and the benefit of Korean Patent Application No. 10-2020-0125121, filed on Sep. 25, 2020, which is hereby incorporated by reference for all purposes as if fully set forth herein.

BACKGROUND

Field

Embodiments of the invention relate generally to a printing pad, a method of manufacturing a window using the printing pad, and a method of manufacturing an electronic device using the printing pad and more specifically, to a printing pad having a printing pattern on a side surface thereof, a method of manufacturing a window using the printing pad, and a method of manufacturing an electronic device using the printing pad.

Discussion of the Background

An electronic device includes a window disposed on a display panel to protect the display panel from external impacts. The window is disposed on an external surface of the electronic device. The window for the exterior surface of the electronic device may determine the design of the electronic device.

Accordingly, patterns are formed in the window not only to protect the display panel, but also to provide various designs to the electronic device. For example, the patterns are formed in the window by transferring an ink onto the window using a printing pad.

In recent years, the development of a pad printing method is in progress to reduce a defect rate of a window manufacturing process and print a clear pattern on the window.

The above information disclosed in this Background section is only for understanding of the background of the inventive concepts, and, therefore, it may contain information that does not constitute prior art.

SUMMARY

Applicant discovered that in patterns formed or printed on a window for an electronic device by using a printing pad with a printing pattern in a printing process, the printed patterns on the window may be distorted such that the printing quality or the reliability of the printing process is degraded.

Printing pads constructed according to the principles of the invention are capable of enhancing the printing quality or the reliability of the printing process by adjusting the inclination angle of the printing pattern of the printing pad such that the quality of the printing patterns on the window of the electronic device may be improved.

Methods of manufacturing a window for an electronic device according to the principles of the invention are capable of enhancing the printing quality or the reliability of the printing process by adjusting the inclination angle of the printing pattern of the printing pad such that the quality of the printing patterns on the window of the electronic device may be improved.

According to an aspect of the invention, a method of manufacturing a window includes the steps of: providing an ink pattern to a printing pad; providing the printing pad and the ink pattern to a target substrate such that the ink pattern is transferred to the target substrate; and removing the printing pad from the target substrate, the ink pattern including: a first bezel line surrounding at least one hole; and a second bezel line surrounding the first bezel line, the printing pad including: a top surface; a bottom surface; and a side surface connecting the top surface and the bottom surface, the side surface including a first pattern portion, in which the first bezel line is formed, and a second pattern portion, in which the second bezel line is formed, wherein the first pattern portion of the printing pad has an inclination angle equal to or greater than about 46 degrees and equal to or smaller than about 90 degrees based on the bottom surface of the printing pad.

The step of providing of the printing pad and the ink pattern may include the step of pressing the printing pad to the target substrate.

The step of providing of the printing pad and the ink pattern may include the step of moving the printing pad and the ink pattern to be in contact with the target substrate.

The ink pattern may include a light blocking material.

The target substrate may include a first bezel area, a transmission area, and a second bezel area surrounding the transmission area defined in the target substrate after the step of removing of the printing pad, wherein: each of the first and second bezel areas may be a light blocking area, and the transmission area may be a light transmission area.

The printing pad may include at least one of silicone and rubber.

The target substrate may include a glass material.

The target substrate may have a thickness equal to or greater than about 20 μm and equal to or smaller than about 80 μm.

The target substrate may include a synthetic resin.

The target substrate may be flexible.

According to another aspect of the invention, a method of manufacturing an electronic device includes the steps of: providing an ink pattern to a printing pad; providing the printing pad and the ink pattern to a target substrate such that the ink pattern is transferred to the target substrate; removing the printing pad from the target substrate; and placing a display panel including a pixel under the target substrate, the ink pattern including: a first bezel line surrounding at least one hole; and a second bezel line surrounding the first bezel line, the printing pad including: a top surface; a bottom surface; and a side surface connecting the top surface and the bottom surface, the side surface including a first pattern portion, in which the first bezel line is formed, and a second pattern portion, in which the second bezel line is formed, wherein the first pattern portion of the printing pad has an inclination angle equal to or greater than about 46 degrees and equal to or smaller than about 90 degrees based on the bottom surface of the printing pad.

The ink pattern may include a light blocking material.

The display panel further may include a plurality of signal lines, and the plurality of signal lines do not overlap the hole.

The pixel may not overlap the hole.

The method may further include the step of placing at least one electronic optical module under the display panel after the step of placing of the display panel, wherein the electronic optical module overlaps the hole.

The electronic optical module may be a camera module.

According to another aspect of the invention, a printing pad includes: a first portion including a bottom surface substantially parallel to a plane defined by a first direction and a second direction intersecting the first direction, a first upper surface facing the bottom surface, and a first side surface connecting the bottom surface and the first upper surface; and a second portion extending from the first portion and having a convex shape protruding to a direction intersecting the first direction and the second direction, the second portion including: a second upper surface facing the bottom surface of the first portion; and a second side surface connecting the second upper surface and the first upper surface of the first portion, the second side surface of the second portion including: a first pattern portion disposed adjacent to the second upper surface of the second portion; and a second pattern portion disposed between the first pattern portion and the first upper surface of the first portion, wherein the first pattern portion of the second side surface of the second portion has an inclination angle equal to or greater than about 46 degrees and equal to or smaller than about 90 degrees based on the bottom surface of the first portion.

The first and second portions may include at least one of silicone and rubber.

The first side surface of the first portion, the second side surface of the second portion, the first upper surface of the first portion, and the second upper surface of the second portion may include a curved surface.

An area of the second upper surface of the second portion may be smaller than an area of the bottom surface of the first portion.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
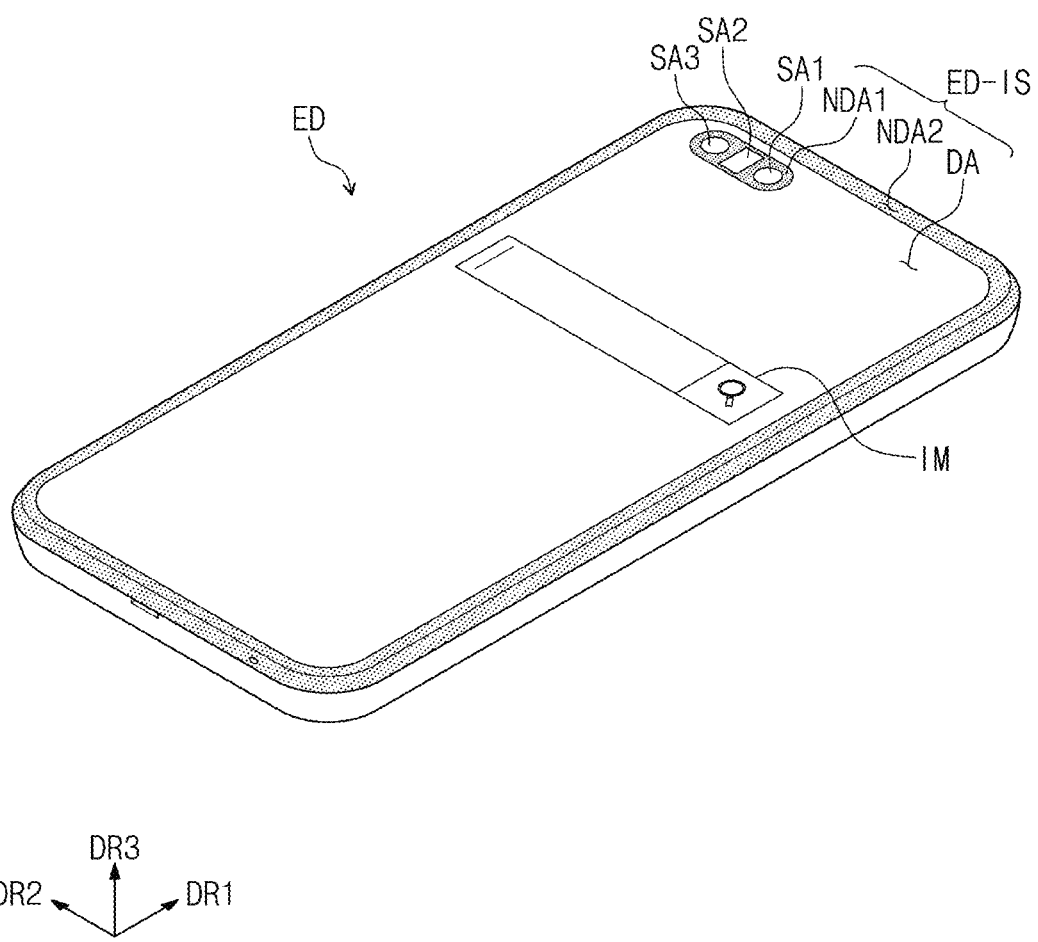
FIG. 1 is a perspective view of an embodiment of an electronic device constructed according to the principle of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be explained in detail with reference to the accompanying drawings.

Figure 2:
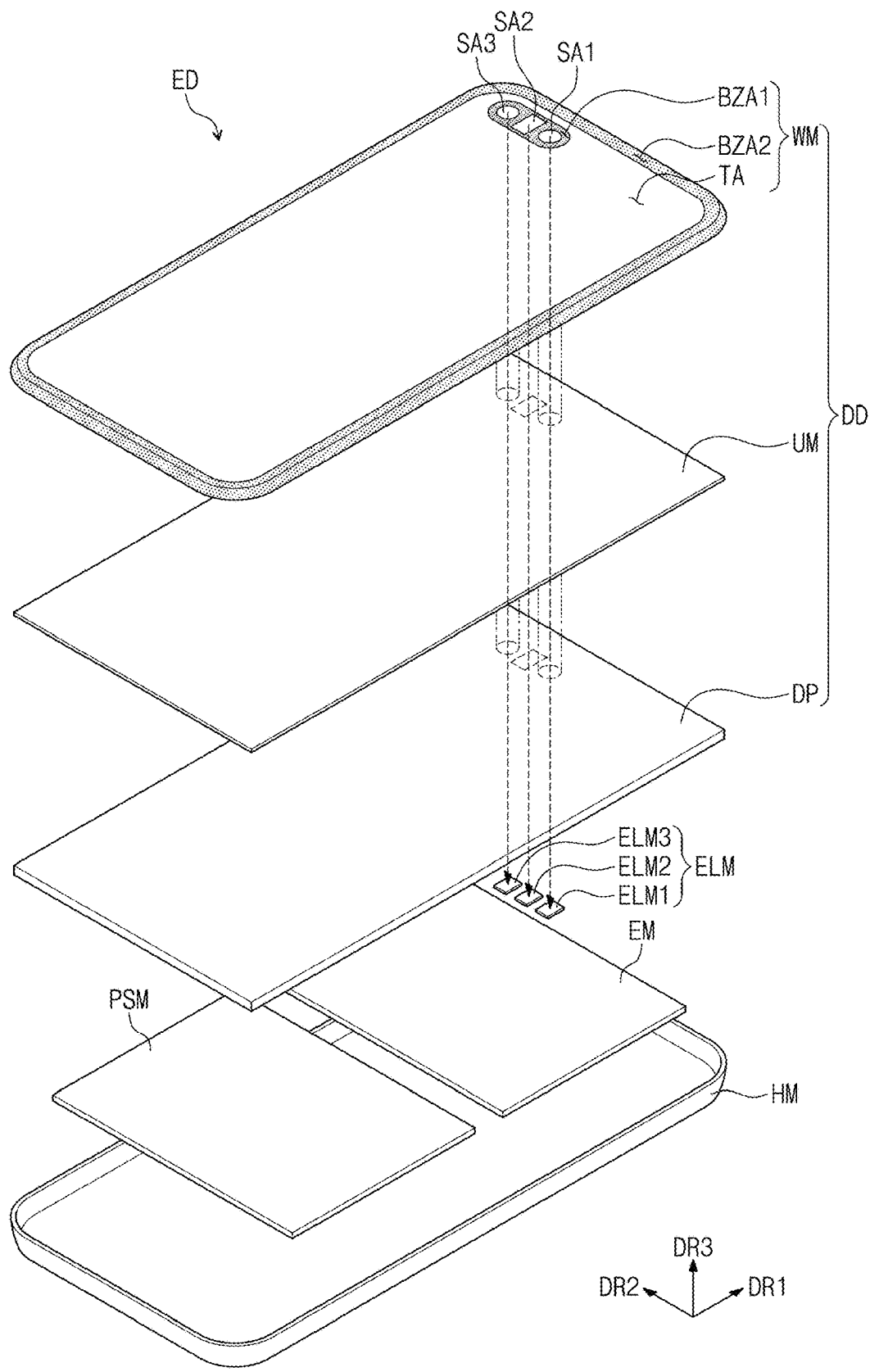
FIG. 2 is an exploded perspective view of the electronic device of FIG. 1.
Figure 3:
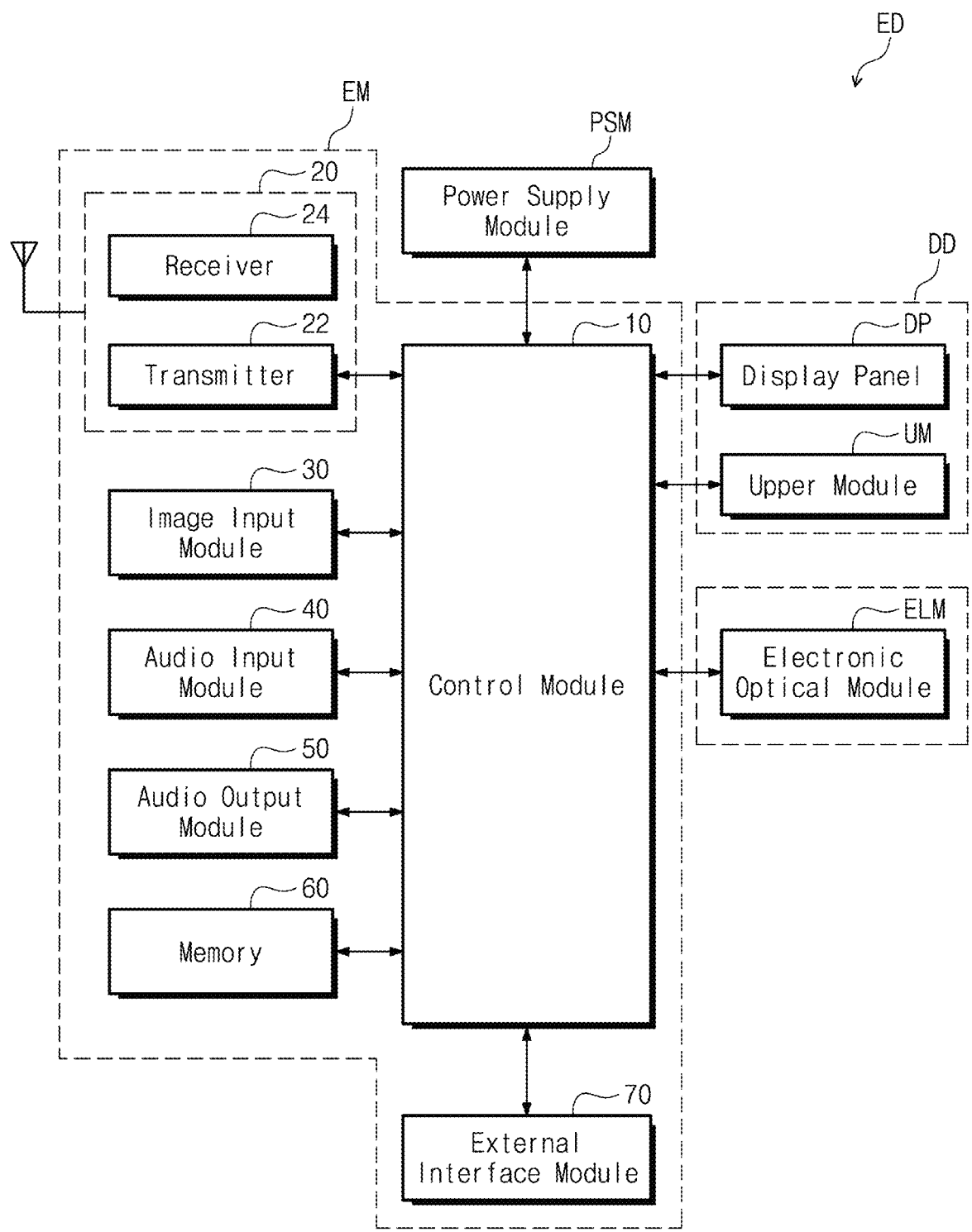
FIG. 3 is a block diagram of the electronic device of FIG. 1.

FIG. 1 is a perspective view showing an electronic device ED according to an embodiment. FIG. 2 is an exploded perspective view showing the electronic device ED according to an embodiment. FIG. 3 is a block diagram showing the electronic device ED according to an embodiment.

Referring to FIG. 1, the electronic device ED may display an image IM through a display surface ED-IS. The display surface ED-IS may be substantially parallel to a plane defined by a first direction DR1 and a second direction DR2. A third direction DR3 indicates a normal line direction of the display surface ED-IS, i.e., a thickness direction of the electronic device ED. The display surface ED-IS of the electronic device ED may correspond to a front surface of the electronic device ED and may correspond to an upper surface of a window WM.

Hereinafter, front (e.g., upper) and rear (e.g., lower) surfaces of each member or each unit are distinguished from each other by the third direction DR3. However, the first, second, and third directions DR1, DR2, and DR3 are merely exemplary. Hereinafter, first, second, and third directions are defined as directions indicated by the first, second, and third directions DR1, DR2, and DR3 shown in figures.

The display surface ED-IS may include a display area DA and non-display areas NDA1 and NDA2 adjacent to the display area DA. The non-display areas NDA1 and NDA2 may be areas through which images are not displayed. The non-display areas NDA1 and NDA2 may include a first non-display area NDA1 and a second non-display area NDA2.

For example, the first non-display area NDA1 may be an area that surrounds a sensor area. The sensor area may be an area that transmits an optical signal or receives an external optical signal. For example, the optical signal may be a natural light from the outside or an infrared ray generated by a light emitting element.

FIG. 1 shows a first sensor area SA1, a second sensor area SA2, and a third sensor area SA3 as the sensor area. However, embodiments are not be limited thereto. For example, at least one of the first, second, and third sensor areas SA1, SA2, and SA3 may be omitted, or four or more sensor areas may be provided.

In addition, FIG. 1 shows a structure in which the first, second, and third sensor areas SA1, SA2, and SA3 are defined in a left upper end of the display area DA. However, embodiments are not limited thereto. For example, according to another embodiment, the first, second, and third sensor areas SA1, SA2, and SA3 may be defined in various areas, such as a right upper end, a center, a left lower end, or a right lower end of the display area DA.

For example, the first non-display area NDA1 may be surrounded by the display area DA. The display area DA may display the image IM to the outside. The image IM may include a video image and a still image. FIG. 1 shows a magnifying glass icon and a search window as a representative example.

The second non-display area NDA2 may be an area that blocks an optical signal. For example, the second non-display area NDA2 may be disposed outside the display area DA to surround the display area DA. According to an embodiment, the second non-display area NDA2 may be defined in a side surface of the electronic device ED rather than the front surface of the electronic device ED. According to another embodiment, the second non-display area NDA2 may be omitted.

For example, the second non-display area NDA2 surrounds the display area DA, but, embodiments are not be limited thereto or thereby. The second non-display area NDA2 may be disposed at only one side of the display area DA. According to an embodiment, a portion of the second non-display area NDA2 may extend from the first non-display area NDA1.

In an embodiment, the display surface ED-IS is shown as being flat, however, according to another embodiment, curved areas may be defined at opposite sides of the display surface ED-IS, which face each other in the second direction DR2.

A mobile phone is shown as a representative example, however, the electronic device ED according to the embodiment should not be limited to the mobile phone and may be applied to various information providing devices, such as a television set, a navigation units, a computer monitor, a game unit, or the like.

Referring to FIGS. 2 and 3, the electronic device ED may include a display device DD, an electronic module EM, electronic optical modules ELM1, ELM2, and ELM3, a power supply module PSM, and a housing HM.

The display device DD may generate the images. The display device DD may include a display panel DP, an upper member UM, and a window WM. However, embodiments are not limited thereto. For example, the display panel may be a light emitting type display panel, such as an organic light emitting display panel or a quantum dot light emitting display panel.

According to configurations of the upper member UM, the display device DD may sense an external input and/or an external pressure. The upper member UM may include a variety of members.

For example, the upper member UM may include an optical film and an input sensor.

The optical film may reduce a reflectance of an external light incident to the window WM.

The optical film may include a polarizer and a retarder. The retarder may be a film-type or liquid crystal coating-type retarder and may include a λ/2 retarder and/or a λ/4 retarder. The polarizer may be a film-type polarizer or a liquid crystal coating-type polarizer.

In another embodiment, the optical film may include a destructive interference structure. For instance, the destructive interference structure may include a first reflection layer and a second reflection layer, which are disposed on different layers from each other. First and second reflection lights respectively reflected by the first and second reflection layers may destructively interfere with each other, and thus, the reflectance of the external light may be reduced.

The input sensor may sense the external input generated by a user. The input sensor may sense the external input by a capacitive sensing method, a pressure sensing method, or an electromagnetic induction method.

The upper member UM may further include an adhesive layer for attaching the optical film to the input sensor.

The window WM may provide an exterior of the electronic device ED. The window WM may include a base substrate and may further include functional layers, such as an anti-reflective layer, an anti-fingerprint layer, etc.

For example, the display device DD may further include at least one adhesive layer. The adhesive layer may attach the window WM to the upper member UM or may attach the upper member UM to the display panel DP. The adhesive layer may be an optically transparent adhesive layer or a pressure sensitive adhesive layer.

The electronic module EM may include a control module 10, a wireless communication module 20, an image input module 30, an audio input module 40, an audio output module 50, a memory 60, and an external interface module 70. The elements of the electronic module EM may be mounted on a circuit board or may be electrically connected to the circuit board through a flexible circuit board. The electronic module EM may be electrically connected to the power supply module PSM.

The control module 10 may control an overall operation of the electronic device ED. For example, the control module 10 may activate or deactivate the display device DD in response to the user's input. The control module 10 may control other modules, such as the image input module 30, the audio input module 40, the audio output module 50, or the like, in response to the user's input. The control module 10 may include at least one microprocessor.

The wireless communication module 20 may transmit or receive a wireless signal to or from other terminals using a Bluetooth or WiFi link. The wireless communication module 20 may transmit or receive a voice signal using a general communication line. The wireless communication module 20 may include a transmitter 22 that modulates a signal to be transmitted and transmits the modulated signal and a receiver 24 that demodulates the signal applied thereto.

The image input module 30 may process an image signal and may convert the image signal into image data that may be displayed through the display device DD. The audio input module 40 may receive an external sound signal through a microphone in a record mode or a voice recognition mode and may convert the external sound signal to electrical voice data. The audio output module 50 may convert sound data provided thereto from the wireless communication module 20 or sound data stored in the memory 60, and may output the converted sound data to the outside.

The external interface module 70 may serve as an interface between the control module 10 and external devices, such as an external charger, a wired data port, a wireless data port, a card socket (e.g., a memory card, a Subscriber Identification Module (SIM) card, and a User Identity Module (UIM) card), etc.

The power supply module PSM may supply a power required for the overall operation of the electronic device ED. The power supply module PSM may include a conventional battery device.

The housing HM shown in FIG. 2 is coupled to the display device DD, particularly, the window WM, to accommodate other modules. In FIG. 2, the housing HM formed in a single unit is shown as a representative example. However, the housing HM may include two or more components assembled to each other.

The electronic optical module ELM may be an electronic component that outputs or receives the optical signal. The electronic optical module ELM may be disposed under the display device DD, and particularly, may be disposed under the display panel DP. The display device DD may include at least one electronic optical module ELM.

For example, the electronic optical module ELM may overlap the first, second, and third sensor areas SA1, SA2, and SA3.

According to the embodiment, areas of the display device DD, which overlap the first, second, and third sensor areas SA1, SA2, and SA3, may have a transmittance higher than that of other areas of the display device DD, which do not overlap the first, second, and third sensor areas SA1, SA2, and SA3. For example, components of the display panel DP and components of the upper member UM may be removed in areas overlapping the first, second, and third sensor areas SA1, SA2, and SA3. In another embodiment, the first, second, and third sensor areas SA1, SA2, and SA3 may be a through hole. According to an embodiment, at least one optical module ELM may be accommodated in the through hole.

Accordingly, the electronic optical module ELM may easily transmit or receive signals through the first, second, and third sensor areas SA1, SA2, and SA3.

The electronic optical module ELM may transmit or receive the optical signal through the first, second, and third sensor areas SA1, SA2, and SA3 shown in FIG. 2. For example, in an embodiment, the electronic optical module ELM may include a camera module. The electronic optical module ELM may receive a natural light to take an image of an external object. In another embodiment, the electronic optical module ELM may include a proximity sensor or an infrared light sensor. According to an embodiment, the first and third sensor areas SA1 and SA3 may be the infrared light sensor. The second sensor SA2 may be the camera module.

Hereinafter, the display device DD will be described in detail.

Figure 4A:
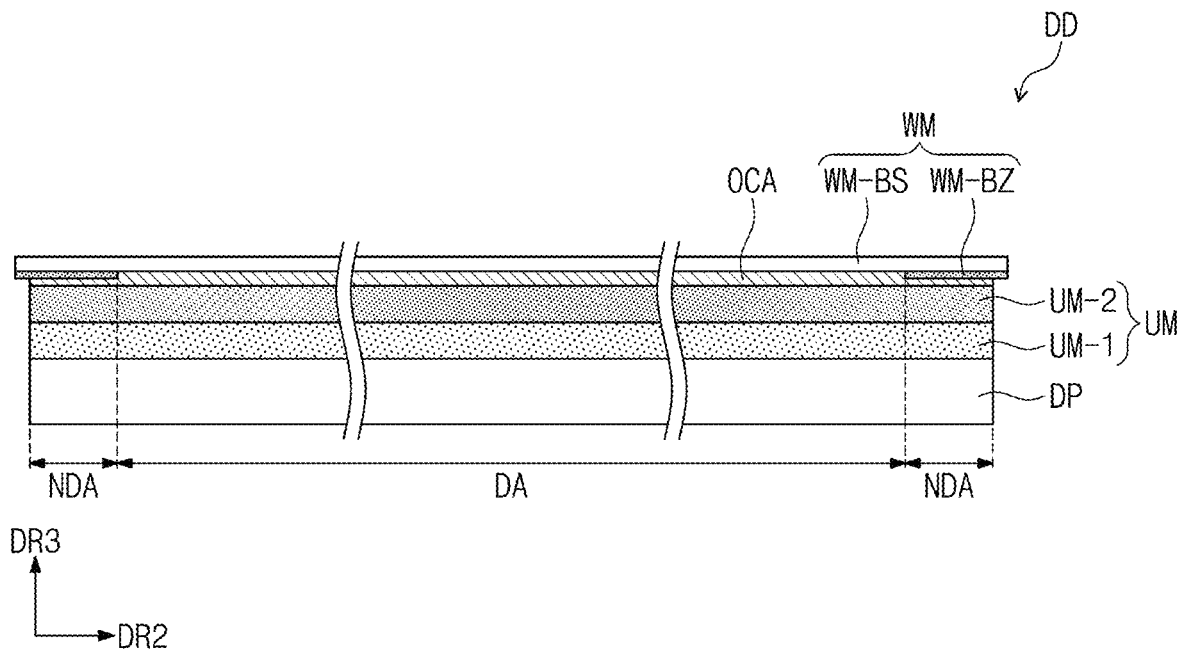
FIGS. 4A and 4B are cross-sectional views of embodiments of the display device of FIG. 2.
Figure 4B:
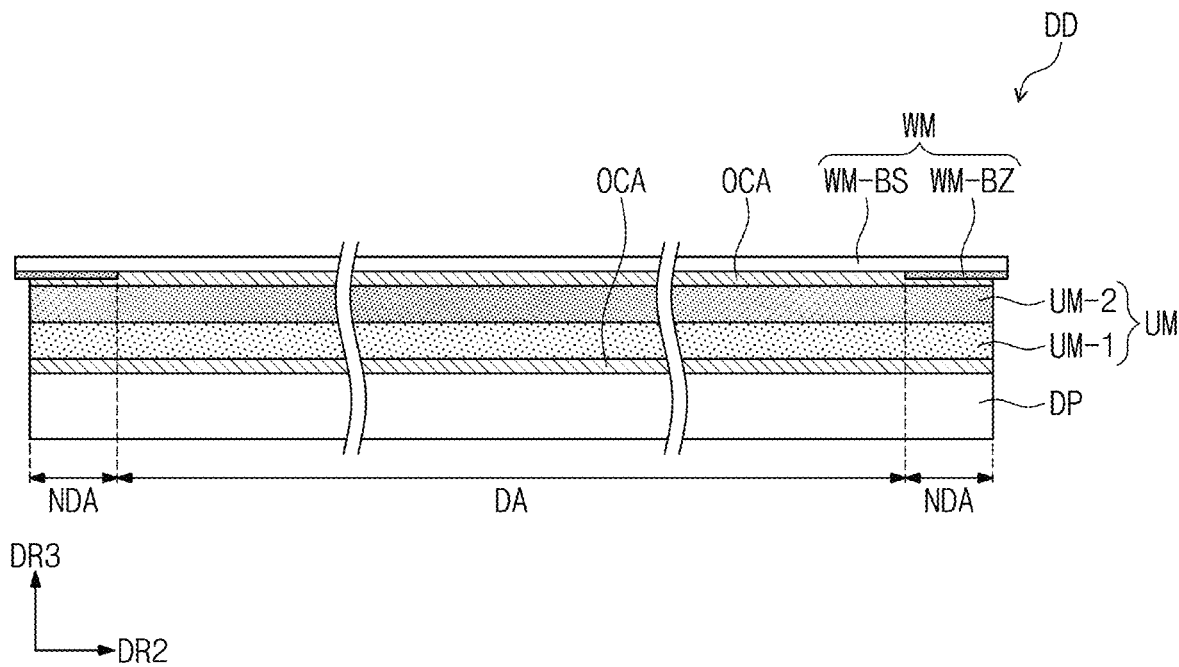

FIGS. 4A and 4B are cross-sectional views showing display devices DD according to an embodiment. In FIGS. 4A and 4B, the same reference numerals denote the same elements in FIGS. 1, 2, and 3, and thus, detailed descriptions of the same elements will be omitted.

Referring to FIGS. 4A and 4B, the display device DD may include the display panel DP, the upper member UM, and the window WM. The upper member UM may include an input sensor UM-1 and an optical film UM-2. As shown in FIGS. 4A and 4B, the window WM and the optical film UM-2 may be coupled to each other by an adhesive layer OCA.

The optical film UM-2 may have a multi-layer structure including an adhesive layer. The optical film UM-2 may be attached to an upper surface of the input sensor UM-1 by the adhesive layer.

An opening area may be defined in the optical film UM-2 to correspond to the first, second, and third sensor areas SA1, SA2, and SA3 shown in FIG. 2. Due to the opening area, a transmittance of the natural light may increase.

As shown in FIGS. 4A and 4B, the display device DD may include the display panel DP, the upper member UM, and the window WM, which are sequentially stacked one on another.

The window WM may include a base substrate WM-BS and a bezel pattern WM-BZ. The base substrate WM-BS may include an optically transparent insulating material.

The base substrate WM-BS may have a flexible property. For example, the base substrate WM-BS may include a synthetic resin such as polyimide.

In another embodiment, the base substrate WM-BS may include an ultra-thin glass (UTG). In detail, the base substrate WM-BS may include a glass material and may have a thickness equal to or greater than about 20 μm and equal to or smaller than about 80 μm. When the thickness of the base substrate WM-BS is smaller than about 20 μm, the window WM may not have sufficient strength and may be easily damaged by external impacts. For example, the window WM of the flexible display device DD may be damaged when the display device DD is repeatedly folded and unfolded. When the thickness of the base substrate WM-BS is greater than about 80 μm, the flexible property of the window WM may be lowered, and thus, the folding and unfolding operation of the display device may not be performed smoothly.

The bezel pattern WM-BZ may have a multi-layer structure. The bezel pattern WM-BZ may include at least one of a colored layer and a light blocking layer having a black color. The bezel pattern WM-BZ may be formed on the base substrate WM-BS through depositing, printing, and coating processes. As an example, the bezel pattern WM-BZ may be formed by printing an ink containing a light blocking material on the base substrate WM-BS.

The input sensor UM-1 shown in FIG. 4A may be disposed directly on a base surface provided by the display panel DP. In the descriptions, the expression that a component "B" is disposed directly on a component "A" means that any separate adhesive layer is not disposed between the component "B" and the component "A". The component "B" may be formed on a base surface provided by the component "A" through successive processes after the component "A" is formed.

As shown in FIG. 4B, the input sensor UM-1 may be coupled to the display panel DP after being separately formed. The adhesive layer OCA may be disposed between the input sensor UM-1 and the display panel DP.

Figure 5:
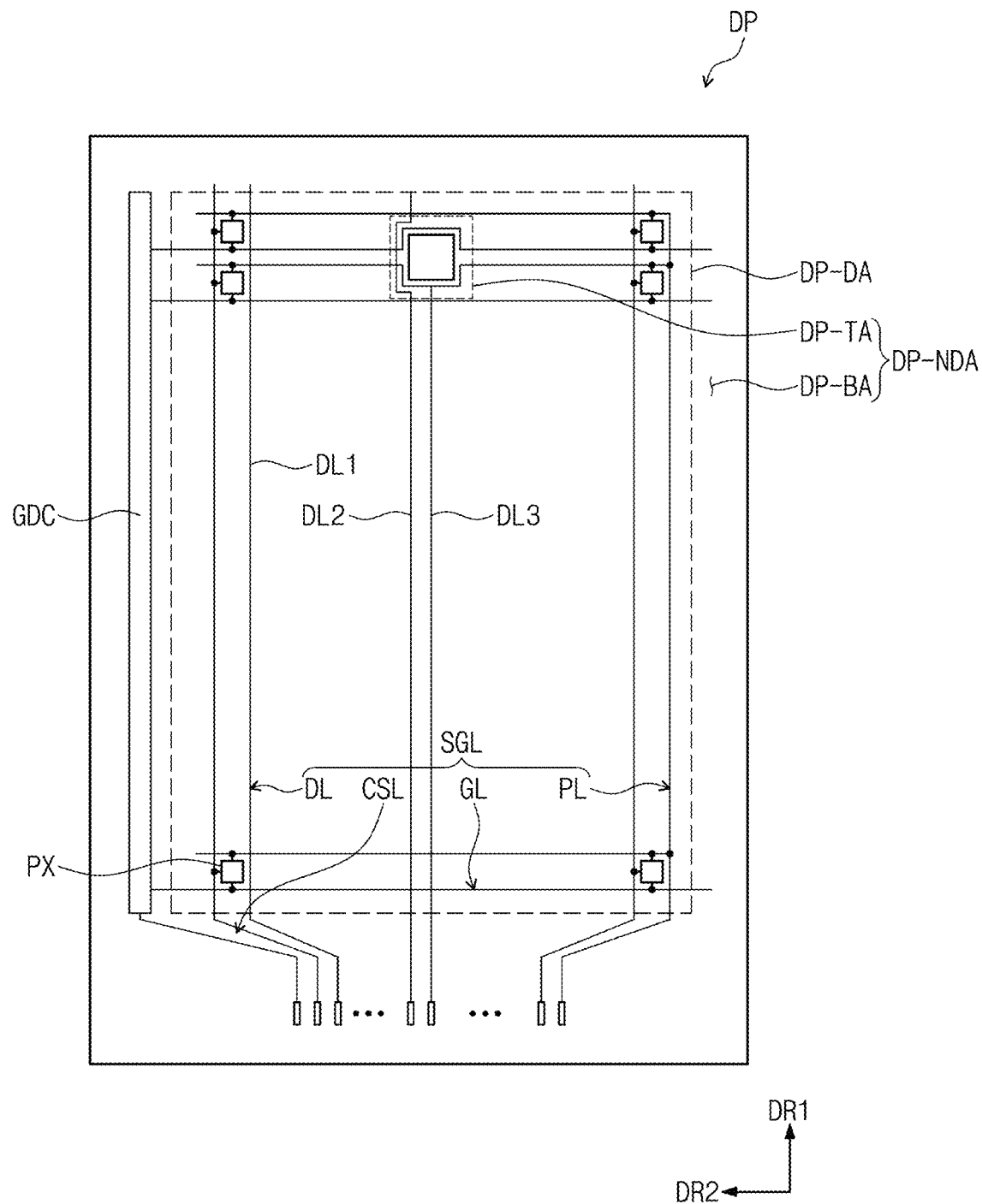
FIG. 5 is a plan view of an embodiment of the display panel of FIG. 2.

FIG. 5 is a plan view showing the display panel DP according to an embodiment.

Referring to FIG. 5, the display panel DP may include an active area DP-DA and a non-active area DP-NDA, which are defined therein.

The display panel DP may include a plurality of signal lines SGL, a plurality of pixels PX, and a driving circuit GDC. The pixels PX may be disposed in the active area DP-DA. Each of the pixels PX may include an organic light emitting diode and a pixel driving circuit connected to the organic light emitting diode. The pixels PX may not be disposed in the non-active area DP-NDA. The non-active area DP-NDA may have a light transmittance higher than that of the active area DP-DA. The non-active area DP-NDA may serve as a transmission passage or path of the optical signal.

The non-active area DP-NDA may include a first non-active area DP-BA and a second non-active area DP-TA. The first non-active area DP-BA may surround the active area DP-DA. The second non-active area DP-TA may be defined in the active area DP-DA. The signal lines SGL, the pixels PX, and the driving circuit GDC may not be disposed in the second non-active area DP-TA.

FIG. 5 shows one second non-active area DP-TA as a representative example, and the second non-active area DP-TA may overlap the second sensor area SA2 shown in FIG. 2. However, embodiments are not be limited thereto. For example, two or more second non-active areas DP-TA may be provided, and the two or more second non-active areas DP-TA may overlap the first, second, and third sensor areas SA1, SA2, and SA3 shown in FIG. 2.

The driving circuit GDC may be disposed in the first non-active area DP-BA. In an embodiment, the driving circuit GDC may include a scan driving circuit. The scan driving circuit may generate a plurality of scan signals, and may sequentially output the plurality of scan signals to a plurality of scan lines GL. The scan driving circuit may further output another control signal to the driving circuit of the pixels PX.

The scan driving circuit may include a plurality of thin film transistors formed through the same process, for instance, a low temperature polycrystalline silicon (LTPS) process or a low temperature polycrystalline oxide (LTPO) process. For example, the plurality of thin film transistors and the driving circuit of the pixels PX may be formed by the same process.

The signal lines SGL may include the scan lines GL, data lines DL, a power line PL, and a control signal line CSL. The signal lines SGL may further include separate reset lines and separate emission lines. Each of the scan lines GL may be connected to a corresponding pixel PX among the pixels PX, and each of the data lines DL may be connected to a corresponding pixel PX among the pixels PX. The power line PL may be connected to the pixels PX. The control signal line CSL may apply control signals to the scan driving circuit.

The signal lines SGL may be connected to a circuit board. The signal lines SGL may be connected to a timing controller mounted on the circuit board in the form of integrated chip.

Figure 6:
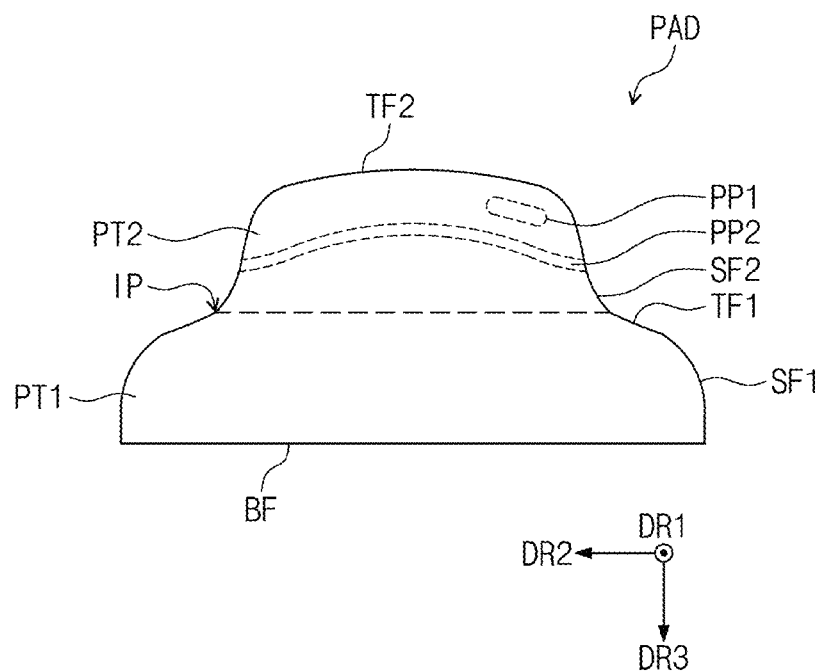
FIGS. 6 and 7 are plan views of an embodiment of a printing pad constructed according to the principles of the invention.
Figure 7:
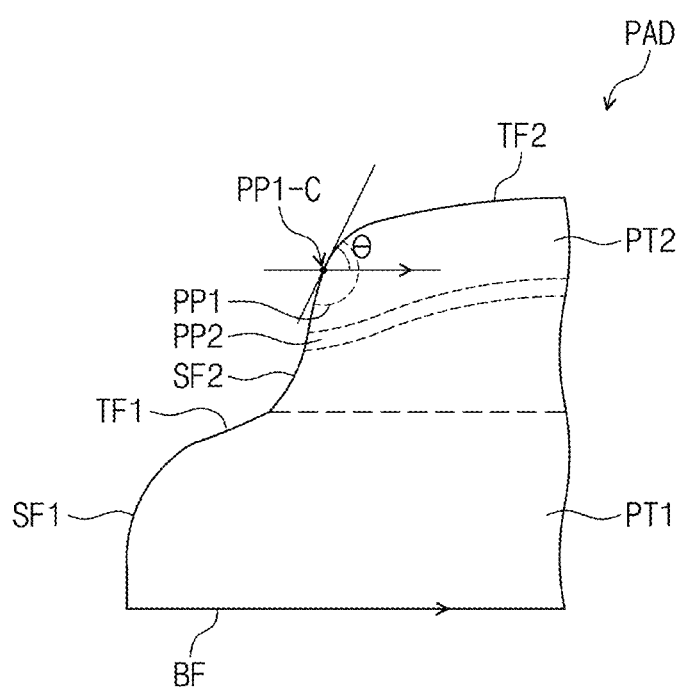

FIGS. 6 and 7 are plan views showing a printing pad PAD according to an embodiment. For example, FIGS. 6 and 7 are plan views of the printing pad PAD when viewed in the first direction DR1.

Referring to FIG. 6, the printing pad PAD may include a first portion PT1 and a second portion PT2. The first portion PT1 and the second portion PT2 may include at least one of silicone and rubber.

The first portion PT1 may include a bottom surface BF substantially parallel to a plane defined by the first direction DR1 and the second direction DR2, a first upper surface TF1 facing the bottom surface BF, and a first side surface SF1 connecting the bottom surface BF and the first upper surface TF1.

The bottom surface BF may be a flat surface, and the first upper surface TF1 and the first side surface SF1 may be a curved surface.

The second portion PT2 may extend from the first portion PT1. The second portion PT2 may extend from the first upper surface TF1 of the first portion PT1 to a direction intersecting the first direction DR1 and the second direction DR2. In detail, the second portion PT2 may have a shape that is convex from the first upper surface TF1 to a direction opposite to the third direction DR3.

The first portion PT1 and the second portion PT2 may be distinguished from each other by an inflection point IP as their boundary. In detail, the first portion PT1 and the second portion PT2 may be distinguished from each other with respect to the inflection point IP of an inclination angle between by the first upper surface TF1 and a second side surface SF2.

The second portion PT2 may include a second upper surface TF2 facing the bottom surface BF and the second side surface SF2 connecting the second upper surface TF2 and the first upper surface TF1. The second upper surface TF2 and the second side surface SF2 may be a curved surface.

The second side surface SF2 may include a first pattern portion PP1 and a second pattern portion PP2. The first pattern portion PP1 may be disposed closer to the second upper surface TF2 than the second pattern portion PP2 when viewed in the third direction DR3. In addition, the second pattern portion PP2 may be disposed between the first pattern portion PP1 and the first upper surface TF1 when viewed in the third direction DR3. In a manufacturing method of the window WM, each of the first pattern portion PP1 and the second pattern portion PP2 may be a portion where an ink is transferred in the printing pad PAD.

Referring to FIG. 7, an inclination angle θ of the first pattern portion PP1 may be within a range equal to or greater than about 46 degrees and equal to or smaller than about 90 degrees based on the bottom surface BF. For example, the inclination angle θ of the first pattern portion PP1 may be within a range equal to or greater than about 46 degrees and equal to or smaller than about 80 degrees based on the bottom surface BF. The inclination angle θ of the first pattern portion PPT1 may be defined as an angle between a line substantially parallel to the bottom surface BF and a tangent line of a center PP1-C of the first pattern portion PPT1. The inclination angle θ of the first pattern portion PP1 will be described in detail with reference to FIGS. 12A and 12B.

Figure 8:
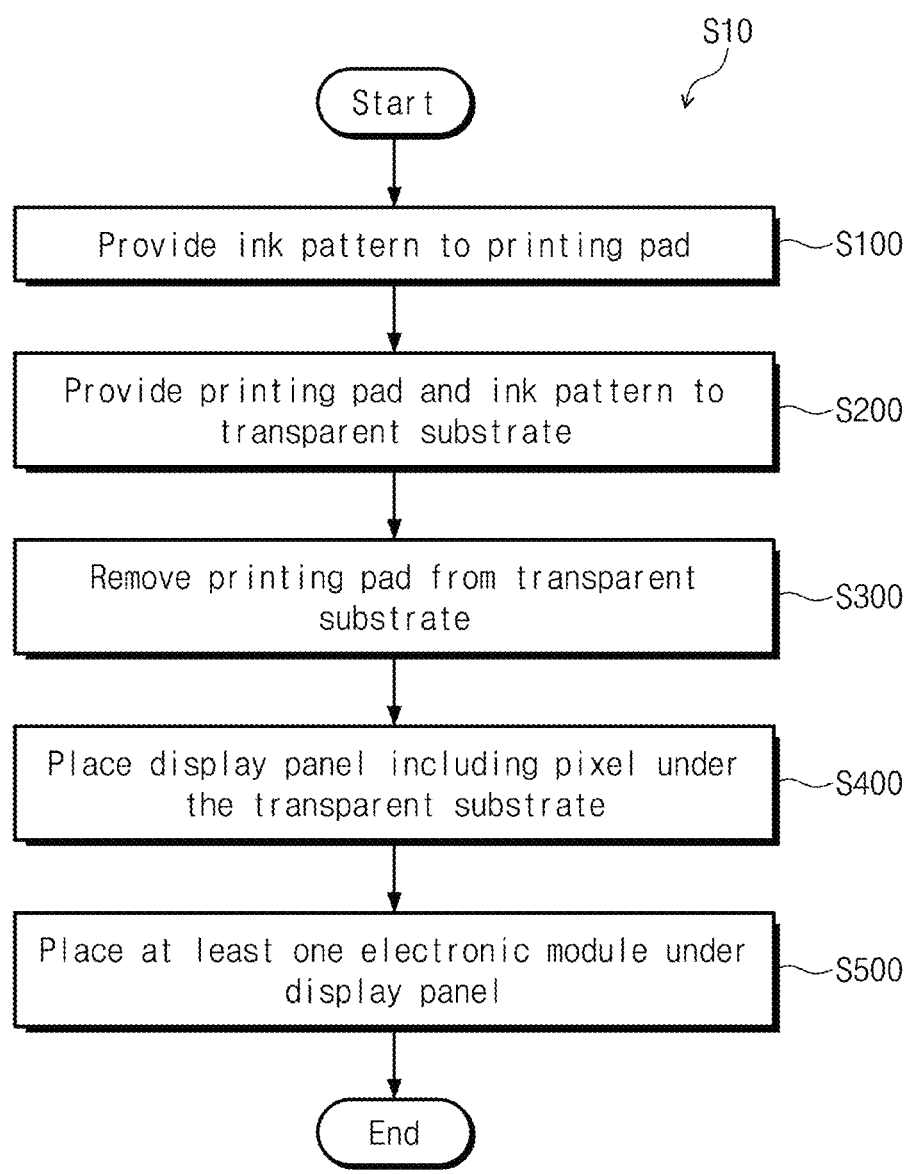
FIG. 8 is a flowchart showing an embodiment of a method of manufacturing the electronic device of FIG. 1.

FIG. 8 is a flowchart showing a method (S10) of manufacturing the electronic device ED according to an embodiment. FIGS. 9A, 9B, 9C, and 9D are views showing a method of manufacturing the window WM according to an embodiment.

Referring to FIG. 8, the manufacturing method (S10) of the electronic device ED may include a first step of providing an ink pattern PN on the printing pad PAD (S100), a second step of providing the printing pad PAD and the ink pattern PN on a target substrate BS (S200), a third step of removing the printing pad PAD from the target substrate BS (S300), a fourth step of placing the display panel DP including the pixel PX under the target substrate BS (S400), and a fifth step of placing at least one electronic optical module ELM under the display panel DP (S500).

For example, the first step S100, the second step S200, and the third step S300 may be the manufacturing method of the window WM. When the fourth and fifth steps S400 and S500 are applied to the window WM formed by the first, second, and third steps S100, S200, and S300, the electronic device ED may be formed.

The first step S100 will be described with reference to FIGS. 8, 9A, and 9B.

Figure 9A:
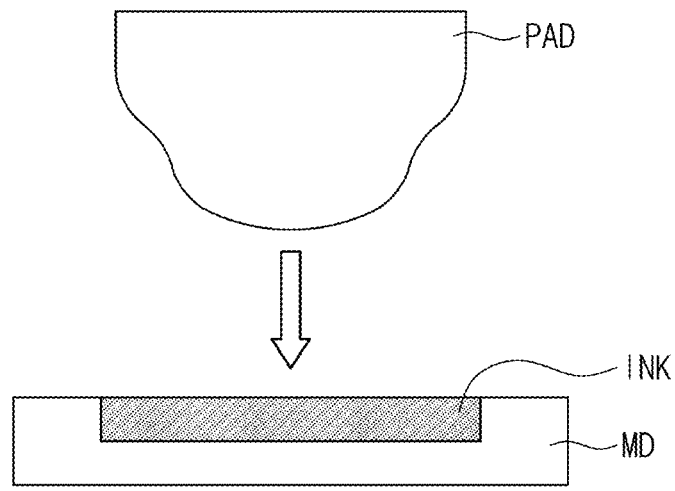
FIGS. 9A, 9B, 9C, and 9D are views showing an embodiment of a method of manufacturing the window of FIG. 2 according to the principles of the invention.

FIG. 9A shows the process to imprint a mold MD on the printing pad PAD. The ink INK may be provided in the mold MD. The ink INK may include a light blocking material. In detail, the ink INK may include a black-colored material, e.g., a carbon black.

Figure 9B:
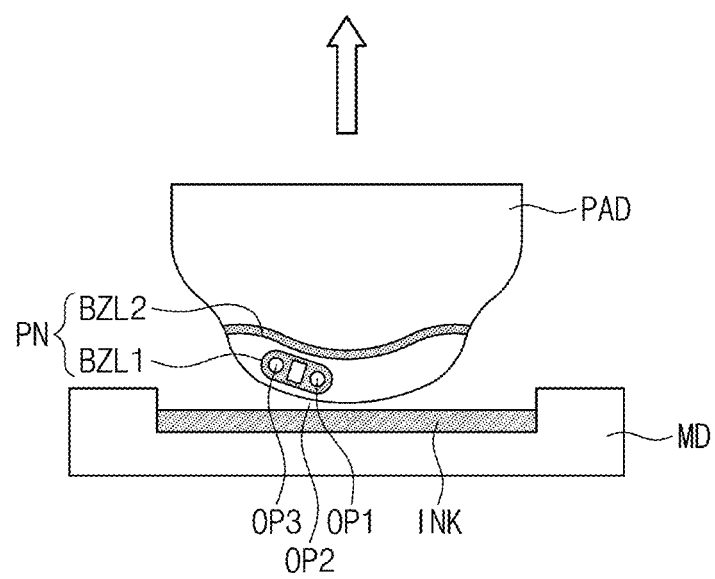

Referring to FIG. 9B, after the mold MD is imprinted on the printing pad PAD, the ink pattern PN may be formed on the printing pad PAD. The ink pattern PN may be substantially the same material as the ink INK.

The ink pattern PN may include a first bezel line BZL1 surrounding at least one hole and a second bezel line BZL2 surrounding the first bezel line BZL1. For example, the first bezel line BZL1 may have a shape surrounding a first hole OP1, a second hole OP2, and a third hole OP3. The first, second, and third holes OP1, OP2, and OP3 may correspond to the first, second, and third sensor areas SA1, SA2, and SA3 shown in FIG. 2.

However, the shape of the first bezel line BZL1 should not be limited thereto or thereby, and the number of the holes may be equal to or smaller than two or equal to or greater than four by taking into account the sensor areas SA1, SA2, and SA3 of FIG. 2.

For example, when the ink pattern PN is formed on the printing pad PAD, the first bezel line BZL1 may be formed in the first pattern portion PP1 (refer to FIG. 6), and the second bezel line BZL2 may be formed in the second pattern portion PP2 (refer to FIG. 6).

Accordingly, when the printing pad PAD is pressed to the target substrate BS, the first bezel line BZL1 may be transferred without being distorted in shape. Therefore, when the target substrate BS is printed using the printing pad PAD, a printing quality may be improved.

Figure 9C:
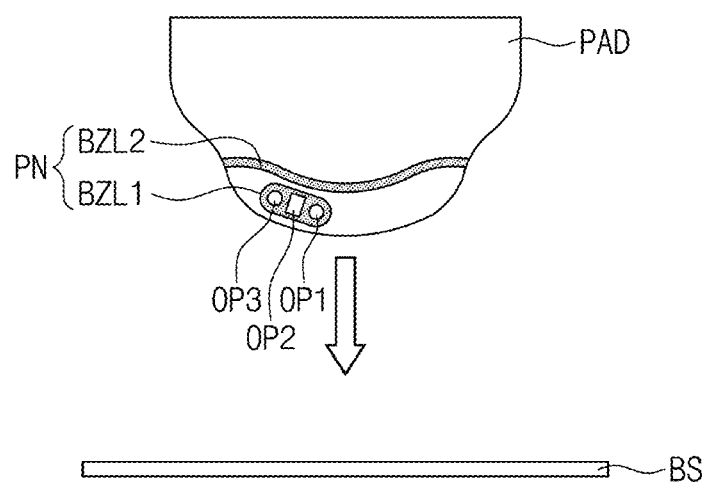

Referring to FIGS. 8 and 9C, in the second step S200, the printing pad PAD and the ink pattern PN may be provided to the target substrate BS. In detail, the second step S200 may be a process of pressing the printing pads PAD toward the target substrate BS. Due to the second step S200, the printing pad PAD and the ink pattern PN may be in contact with the target substrate BS, and the ink pattern PN may be transferred to the target substrate BS.

The target substrate BS may be an optically transparent substrate. For example, the target substrate BS may include a synthetic resin such as polyimide or an ultra-thin glass. The above descriptions regarding the base substrate WM-BS may be applied to the target substrate BS.

Figure 9D:
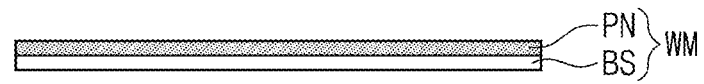

Referring to FIGS. 8 and 9D, the third step S300 may be a process of removing the printing pad PAD from the target substrate BS. Due to the first, second, and third steps S100, S200, and S300, the ink pattern PN may be formed on the target substrate BS. The target substrate BS and the ink pattern PN may serve as the window WM.

The target substrate BS may have substantially the same function as the base substrate WM-BS of the window WM described with reference to FIGS. 4A and 4B. The ink pattern PN may have substantially the same function as the bezel pattern WM-BZ of the window WM described with reference to FIGS. 4A and 4B. The first, second, and third steps S100, S200, and S300 may be the manufacturing method of the window WM according to the embodiment.

The fourth step S400 may be a process in which the display panel DP (refer to FIG. 2) is disposed under the window WM of FIG. 9D. In detail, the display panel DP (refer to FIG. 2) may be disposed under the target substrate BS and the ink pattern PN.

The fifth step S500 may be a process in which at least one electronic optical module ELM (refer to FIG) is placed under the display panel DP (refer to FIG. 2). For example, the electronic optical module ELM (refer to FIG. 2) may include the camera module, the infrared light sensor, etc.

Figure 10:
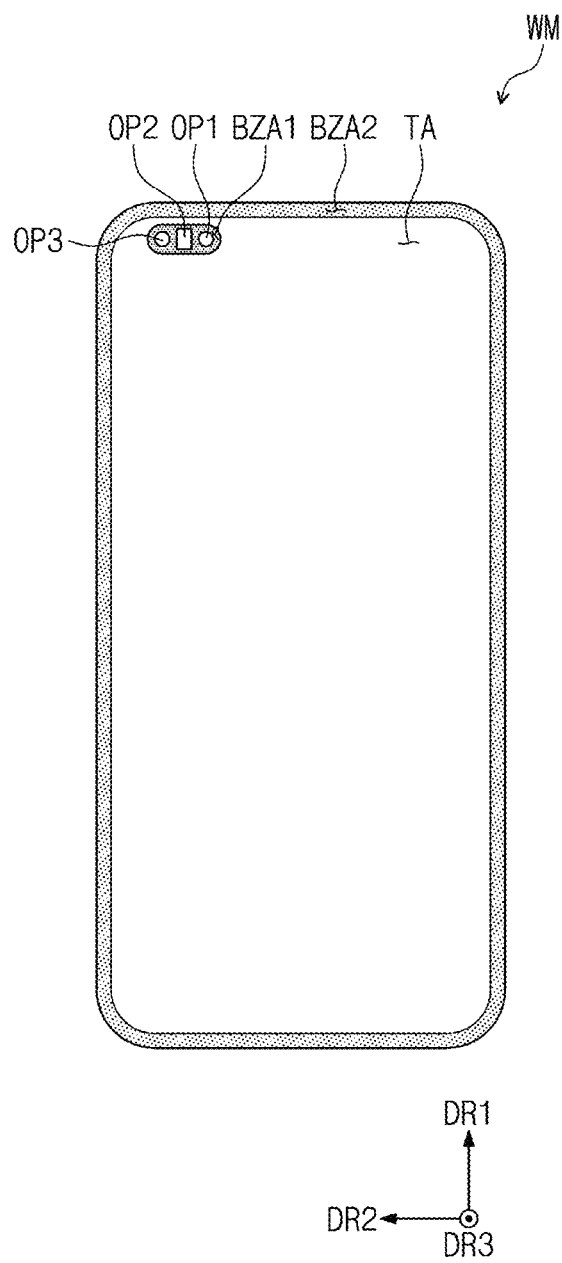
FIG. 10 is a plan view of an embodiment of the window of FIG. 2.

FIG. 10 is a plan view showing the window WM according to an embodiment.

FIG. 10 is a plan view showing the window WM formed by the first, second, and third steps S100, S200, and S300.

The window WM may include a transmission area TA and bezel areas BZA1 and BZA2, which are defined therein.

The transmission area TA may be an optically transparent area. The bezel areas BZA1 and BZA2 may have a light transmittance lower than that of the transmission area TA. The bezel areas BZA1 and BZA2 may include a first bezel area BZA1 and a second bezel area BZA2.

The first bezel area BZA1 may have a shape surrounding at least one hole. The first bezel area BZA1 may have substantially the same shape as that of the first bezel line BZL1 (refer to FIG. 9C). For example, the first bezel area BZA1 may have a shape surrounding the first, second, and third holes OP1, OP2, and OP3.

The first, second, and third holes OP1, OP2, and OP3 may correspond to the first, second, and third sensor areas SA1, SA2, and SA3 described with reference to FIG. 2. The first bezel area BZA1 may correspond to the first non-display area NDA1 of the electronic device ED described with reference to FIG. 2.

The first bezel area BZA1 may prevent inner components of the electronic device ED overlapping the first bezel area BZA1 from being perceived or visibly recognized by a user who uses the electronic device ED. Aesthetics of the electronic device ED may be improved by the first bezel area BZA1.

The transmission area TA may surround the first bezel area BZA1. The transmission area TA may correspond to the display area DA described with reference to FIG. 2.

The second bezel area BZA2 may be disposed adjacent to the transmission area TA and may surround the transmission area TA. The second bezel area BZA2 may have substantially the same shape as that of the second bezel line BZL2 (refer to FIG. 9C).

The second bezel area BZA2 may correspond to the second non-display area NDA2 of the electronic device ED described with reference to FIG. 2.

In addition, the second bezel area BZA2 may correspond to the first non-active area DP-BA of the display panel DP described with reference to FIG. 5. The second bezel area BZA2 may cover the first non-active area DP-BA to prevent the first non-active area DP-BA from being viewed or visibly recognized from the outside.

FIG. 10 shows the window WM as a representative example, and the first and second bezel areas BZA1 and BZA2 may have a variety of shapes. In another embodiment, at least one of the first and second bezel areas BZA1 and BZA2 may be omitted.

Evaluation of the Printing Quality According to the Shape of the Printing Pad

The evaluation is performed on the printing quality of the printing pad. The ink pattern is transferred onto the target substrate using the printing pad of embodiment example 1, comparative example 1, and comparative example 2. The printing pad of embodiment example 1 corresponds to the printing pad according to the embodiment. However, embodiments are not be limited thereto.

Figure 11A:
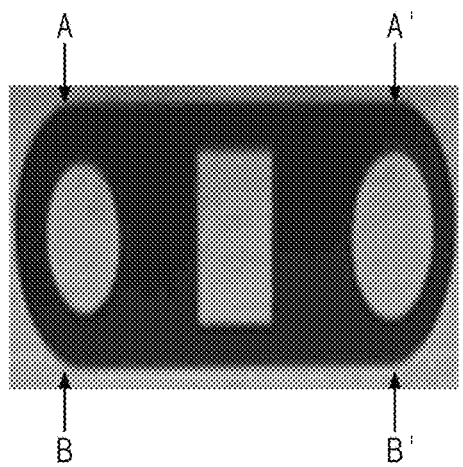
FIG. 11A is a view showing a printed image formed by using the printing pad of an embodiment example according to the principles of the invention.

The printing pad of embodiment example 1 corresponds to the printing pad in which the inclination angle θ of the first pattern portion PP 1 is about 46 degrees according to the embodiment. FIG. 11A shows a printed image of the first bezel line BZL1 formed by the printing pad of embodiment example 1.

Figure 11B:
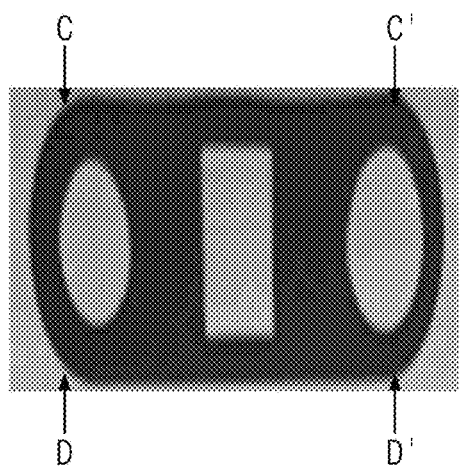
FIGS. 11B and 11C are views showing printed images formed by using the printing pads of comparative examples according to a conventional method.

The printing pad of comparative example 1 corresponds to a conventional printing pad in which an inclination angle of an area corresponding to a first pattern portion PP1 is about 35 degrees. FIG. 11B shows a printed image of a first bezel line BZL1 formed by the printing pad of comparative example 1.

Figure 11C:
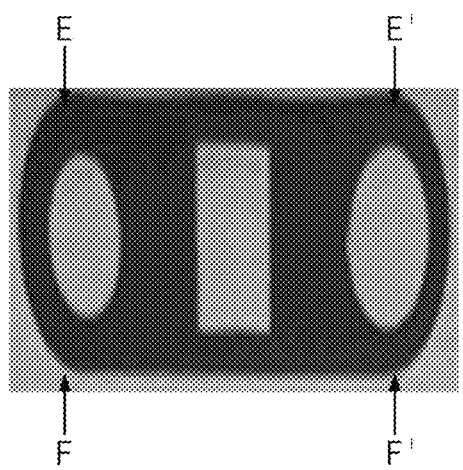

The printing pad of comparative example 2 corresponds to a conventional printing pad in which an inclination angle of an area corresponding to a first pattern portion PP1 is about 23 degrees. FIG. 11C shows a printed image of a first bezel line BZL1 formed by the printing pad of comparative example 2.

Referring to FIG. 11A, a line A-A' and a line B-B' of the printed image are printed to be substantially parallel to each other. Accordingly, it is observed that the printing quality of the printing pad of embodiment example 1 is normal.

Referring to FIG. 11B, a line C-C' and a line D-D' of the printed image are printed not to be parallel to each other. In detail, portions of the line C-C' are distorted. Accordingly, it is observed that the printing quality of the printing pad of comparative example 1 is defective.

Referring to FIG. 11C, a line E-E' and a line F-F' of the printed image are printed not to be parallel to each other. In detail, portions of the line E-E' are distorted. Accordingly, it is observed that the printing quality of the printing pad of comparative example 2 is defective.

Referring to images of FIGS. 11A, 11B, and 11C, since the inclination angle θ of the first pattern portion is controlled to be equal to or greater than about 46 degrees and equal to smaller than about 90 degrees, the printing pad of the embodiment may be printed normally without distorting the printed image.

Figure 12A:
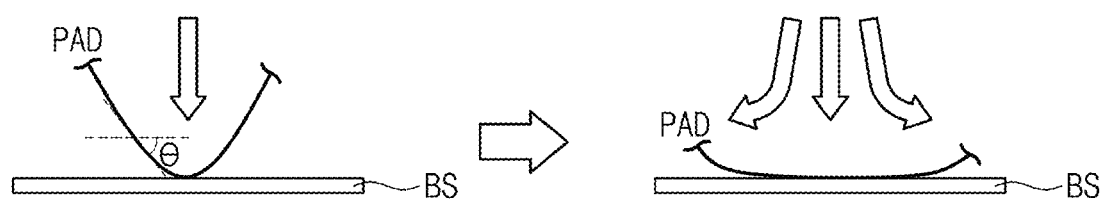
FIG. 12A is a view showing an embodiment of a method of manufacturing the window of FIG. 2 according to the principles of the invention.
Figure 12B:
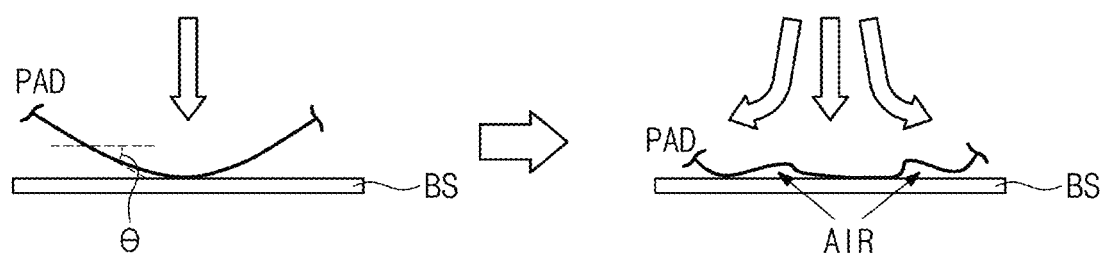
FIG. 12B is a view showing a method of manufacturing a window by using a conventional printing pad according to a conventional method.

FIGS. 12A and 12B are views showing a method of manufacturing the window according to an embodiment. A printing performance of the printing pad according to the inclination angle will be described with reference to FIGS. 12A and 12B.

FIG. 12A schematically shows the printing pad PAD in which the inclination angle θ defined in FIG. 7 is equal to or greater than about 46 degrees according to the embodiment. FIG. 12B schematically shows the conventional printing pad PAD in which the inclination angle θ defined in FIG. 7 is smaller than about 46 degrees.

Referring to FIG. 12A, an air AIR between the printing pad PAD and the target substrate BS may be pushed out in the process where the printing pad PAD of the embodiment makes contact with the target substrate BS. Accordingly, the printing pad PAD and the target substrate BS may be completely in contact with each other, and thus, the printing pad PAD may transfer the ink onto the target substrate BS without distorting the shape of the ink. For example, the ink may be the first bezel line BZL1 (refer to FIG. 9B) provided to the above-mentioned first pattern portion PP1 (refer to FIG. 6). The printing pad PAD according to the embodiment may transfer the first bezel line BZL1 onto the target substrate BS without distorting the shape of the first bezel line BZL1.

For example, the printing pad PAD according to an embodiment includes a top surface, a bottom surface; and a side surface connecting the top surface and the bottom surface. The side surface of the printing pad PAD may include the first pattern portion PP1 and the second pattern portion PP2. When the ink pattern PN is provided to the printing pad PAD, the first bezel line BZL1 may be formed in the first pattern portion PP1, and the second bezel line BZL2 may be formed in the second pattern portion PP2. When the printing pad PAD is not deformed or pressed, the first pattern portion PP1 of the printing pad PAD has an inclination angle θ that is equal to or greater than about 46 degrees based on the bottom surface BF thereof. When the printing pad PAD is pressed and deformed to transfer the first bezel line BZL1 to the target substrate BS, the top surface and the first pattern portion PP1 of the printing pad PAD are substantially flat without any gap between the first pattern portion PP1 and the target substrate BS such that the first bezel line BZL1 is transferred onto the target substrate BS without distorting the shape of the first bezel line BZL1.

Referring to FIG. 12B, when the inclination angle θ of the first pattern portion PP1 of the printing pad PAD is smaller than about 46 degrees before the printing pad PAD is pressed or deformed, an air AIR may remain between the printing pad PAD and the target substrate BS in the process where the printing pad PAD makes contact with the target substrate BS. In other words, when the inclination angle θ of the first pattern portion PP1 of the printing pad PAD is smaller than about 46 degrees before the printing pad PAD is pressed or deformed, the top surface and the first pattern portion PP1 of the printing pad PAD are not substantially flat in the process where the printing pad PAD makes contact with the target substrate BS. Accordingly, when the ink provided to the printing pad PAD is transferred onto the target substrate BS, the shape of the ink may be distorted. For example, the ink may be the first bezel line BZL1 (refer to FIG. 9B) provided to the above-mentioned first pattern portion PP1 (refer to FIG. 6). The shape of the first bezel line BZL1 transferred onto the target substrate SUB by the printing pad PAD of the conventional art may be distorted.

The manufacturing method of the window according to the embodiment may improve a reliability of the process of printing the ink pattern on the target substrate using the printing pad.

The manufacturing method of the electronic device according to the embodiment may reduce a defect rate of the manufacturing process of the electronic device using the printing pad.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a window, the method comprising the steps of:
   providing an ink pattern to a printing pad;
   providing the printing pad and the ink pattern to a target substrate such that the ink pattern is transferred to the target substrate; and
   removing the printing pad from the target substrate, the ink pattern comprising:
   a first bezel line surrounding at least one hole; and
   a second bezel line surrounding the first bezel line, the printing pad comprising:
   a top surface;
   a bottom surface; and
   a side surface connecting the top surface and the bottom surface, the side surface comprising a first pattern portion, in which the first bezel line is formed, and a second pattern portion, in which the second bezel line is formed,
   wherein the first pattern portion of the printing pad has an inclination angle equal to or greater than about 46 degrees and equal to or smaller than about 90 degrees based on the bottom surface of the printing pad.

2. The method of claim 1, wherein the step of providing of the printing pad and the ink pattern comprises the step of pressing the printing pad to the target substrate.

3. The method of claim 1, wherein the step of providing of the printing pad and the ink pattern comprises the step of moving the printing pad and the ink pattern to be in contact with the target substrate.

4. The method of claim 1, wherein the ink pattern comprises a light blocking material.

5. The method of claim 1, wherein the target substrate comprises a first bezel area, a transmission area, and a second bezel area surrounding the transmission area defined in the target substrate after the step of removing of the printing pad, wherein:
   each of the first and second bezel areas is a light blocking area, and
   the transmission area is a light transmission area.

6. The method of claim 1, wherein the printing pad comprises at least one of silicone and rubber.

7. The method of claim 1, wherein the target substrate comprises a glass material.

8. The method of claim 1, wherein the target substrate has a thickness equal to or greater than about 20 μm and equal to or smaller than about 80 μm.

9. The method of claim 1, wherein the target substrate comprises a synthetic resin.

10. The method of claim 1, wherein the target substrate is flexible.

11. A method of manufacturing an electronic device, the method comprising the steps of:
providing an ink pattern to a printing pad;
providing the printing pad and the ink pattern to a target substrate such that the ink pattern is transferred to the target substrate;
removing the printing pad from the target substrate; and
placing a display panel comprising a pixel under the target substrate, the ink pattern comprising:
a first bezel line surrounding at least one hole; and
a second bezel line surrounding the first bezel line, the printing pad comprising:
a top surface;
a bottom surface; and
a side surface connecting the top surface and the bottom surface, the side surface comprising a first pattern portion, in which the first bezel line is formed, and a second pattern portion, in which the second bezel line is formed,
wherein the first pattern portion of the printing pad has an inclination angle equal to or greater than about 46 degrees and equal to or smaller than about 90 degrees based on the bottom surface of the printing pad.

12. The method of claim 11, wherein the ink pattern comprises a light blocking material.

13. The method of claim 11, wherein:
the display panel further comprises a plurality of signal lines, and
the plurality of signal lines do not overlap the hole.

14. The method of claim 11, wherein the pixel does not overlap the hole.

15. The method of claim 11, further comprising the step of placing at least one electronic optical module under the display panel after the step of placing of the display panel, wherein the electronic optical module overlaps the hole.

16. The method of claim 15, wherein the electronic optical module is a camera module.

* * * * *